United States Patent [19]
Metcalf et al.

[11] 4,100,420
[45] Jul. 11, 1978

[54] DISPLACEMENT TRANSDUCERS

[75] Inventors: Eric Metcalf, Ropley, England; Anthony John Ley, Bièvres, France

[73] Assignee: The Solartron Electronic Group Limited, Farnborough, England

[21] Appl. No.: 763,253

[22] Filed: Jan. 26, 1977

[30] Foreign Application Priority Data

Feb. 3, 1976 [GB] United Kingdom ............... 04257/76

[51] Int. Cl.² .......................................... G01N 21/30
[52] U.S. Cl. ............................ 250/561; 250/231 SE; 250/237 G; 307/221 D; 307/311
[58] Field of Search ............. 250/231 SE, 237 G, 561; 356/169; 307/221 D, 311

[56] References Cited

U.S. PATENT DOCUMENTS 3,619,626  11/1971  Rudolph ................................ 250/561
3,748,043  7/1973  Zipin ............................ 250/237 G X
3,916,185  10/1975  Jehly .............................. 250/231 SE

OTHER PUBLICATIONS

Chai et al. "Noise Compensator for Charge—Coupled Devices," IBM Technical Disclosure Bulletin, v. 16, No. 4, Sep. 1973, pp. 1099, 1100.

Primary Examiner—James B. Mullins
Attorney, Agent, or Firm—William R. Sherman; Kevin McMahon; Edward Manzo

[57] ABSTRACT

A displacement transducer comprises a charge coupled device having a plurality of light sensitive stages arranged in a line. An obturating member connected to a member whose displacement is to be transduced is disposed between the charge coupled device and a light source. As the obturating member is moved, it varies the amount of light received by the respective stages of the charge coupled device, so that the charge distribution in the charge coupled device is representative of the position of the obturating member and therefore of the member whose displacement is to be transduced.

15 Claims, 6 Drawing Figures

DISPLACEMENT TRANSDUCERS

BACKGROUND OF THE INVENTION

This invention relates to displacement transducers.

Most known displacement transducers are of an essentially analogue nature, and typical examples for measuring linear and rotary displacements respectively are linear and rotary potentiometers, in which the wiper of the potentiometer is moveable in dependence upon the displacement to be measured. However, when it is desired to process the output signals produced by such transducers digitally, e.g. when the transducers form part of a data logging system, it is necessary to provide an analogue-to-digital converter to convert the output signals into digital form. Some displacement transducers which produce a digital output signal are known, for example, linear displacement transducers based on the counting of Moiree fringes which move in dependence on the displacement to be measured and rotary displacement transducers employing Gray coded optical discs, but they tend to be both expensive and complex.

It is an object of the present invention to provide a simple and reliable displacement transducer, which can be relatively easily arranged to produce a digital output signal.

SUMMARY OF THE INVENTION

According to one aspect of the present invention, therefore, a displacement transducer comprises a charge-coupled device having a plurality of light-sensitive stages arranged in a line extending in the direction of the displacement to be transduced, a light source, and an obturating member disposed between the light source and the charge-coupled device, the charge-coupled device and the obturating member being relatively moveable in dependence upon said displacement, so as to vary the amount of light received by respective stages of the charge-coupled device, whereby in operation, the charge in the respective stages of the charge-coupled device is representative of the relative positions of the charge-coupled device and the obturating member.

Conveniently, the obturating member is adapted to be connected, in use, to a moveable element whose displacement is to be transduced, and the charge-coupled device is arranged to be stationary in use.

The stages of the charge-coupled device may be arranged in a straight line, in order to transduce linear displacements, or in a line extending around at least part of the circumference of a circle, in order to transduce rotary displacements.

Preferably, the stages of the charge-coupled device are uniformly spaced.

In one embodiment of the invention, the obturating member is arranged to prevent the illumination of an increasing number of successive stages of the charge-coupled device in response to relative movement between the obturating member and the charge-coupled device in one direction, and to permit the illumination of an increasing number of successive stages of the charge-coupled device in response to relative movement between the obturating member and the charge-coupled device in the opposite direction. In this case, the transducer may further comprise a clock pulse generator for applying clock pulses to the charge-coupled device to successively shift the respective charge in each stage of the device towards an output stage, whereby to produce from said output stage an output signal whose level takes a succession of values each corresponding to the charge in a respective stage of the device, and a comparator connected to receive said output signal and arranged to produce a control signal when the level of said output signal passes through a predetermined value, said predetermined value lying between the respective values of the level of the output signal which correspond to the charge in an illuminated stage of the device and the charge in a non-illuminated stage of the device. The transducer may also include a counter arranged to count the number of shifts produced prior to the production of said control signal, whereby the count in the counter when said control signal is produced is representative of the relative positions of the charge-coupled device and the obturating member.

In another embodiment of the invention, the obturating member comprises a grating having a plurality of light-transmissive lines thereon, the lines being uniformly spaced apart in the direction of said displacement and their spacing being such that either $N+1$ or $N-1$ lines occupy the same length as the total length occupied by all the stages of the device, where N is the number of the stages, whereby the charge distribution in the device corresponds to one cycle of a triangular wave whose phase changes substantially linearly through 360° as the obturating member moves a distance equal to the spacing of two adjacent stages of the device. In this case, the transducer may further comprise a clock pulse generator for applying clock pulses to the device to successively shift the respective charge in each stage of the device towards an output stage, whereby to produce an output signal whose level takes a succession of values each corresponding to the charge in a respective stage of the device, and means for determining the phase difference between a reference triangular wave and the output signal produced during N shifts.

The phase difference determining means may conveniently comprise a further N stage charge-coupled device connected to receive said output signal and said clock pulses, such that said output signal is shifted through the further device at the same rate as the charge is shifted through the first mentioned device, a plurality of weighted outputs each connected between a respective stage of the further device and the input of a summing amplifier, said weighted outputs being weighted in accordance with a weighting function corresponding to said reference triangular wave, and a comparator connected to the output of the summing amplifier and arranged to produce a first control signal when the level of the summed signal at the output of the summing amplifier passes through a predetermined value.

Advantageously, the grating includes one line which is adapted to transmit substantially more light than the other lines, in which case the transducer preferably includes a further comparator connected to receive said output signal and arranged to produce a further control signal when the level of said output signal passes through a predetermined value lying between the respective values of the level of the output signal which correspond to the charge in a stage of the first device illuminated via said one line of the grating and the charge in a stage of the first device fully illuminated via any one of the other lines of the grating.

The transducer may include a first counter arranged to count the number of shifts in excess of N produced prior to the production of the first control signal, and may also include a second counter arranged to count the number of shits produced prior to the production of the further control signal.

BRIEF DESCRIPTION OF THE DRAWINGS

The invention will now be described, by way of non-limitative example only, with reference to the accompanying drawings, of which.

DESCRIPTION OF PREFERRED EMBODIMENTS

Figure 1:
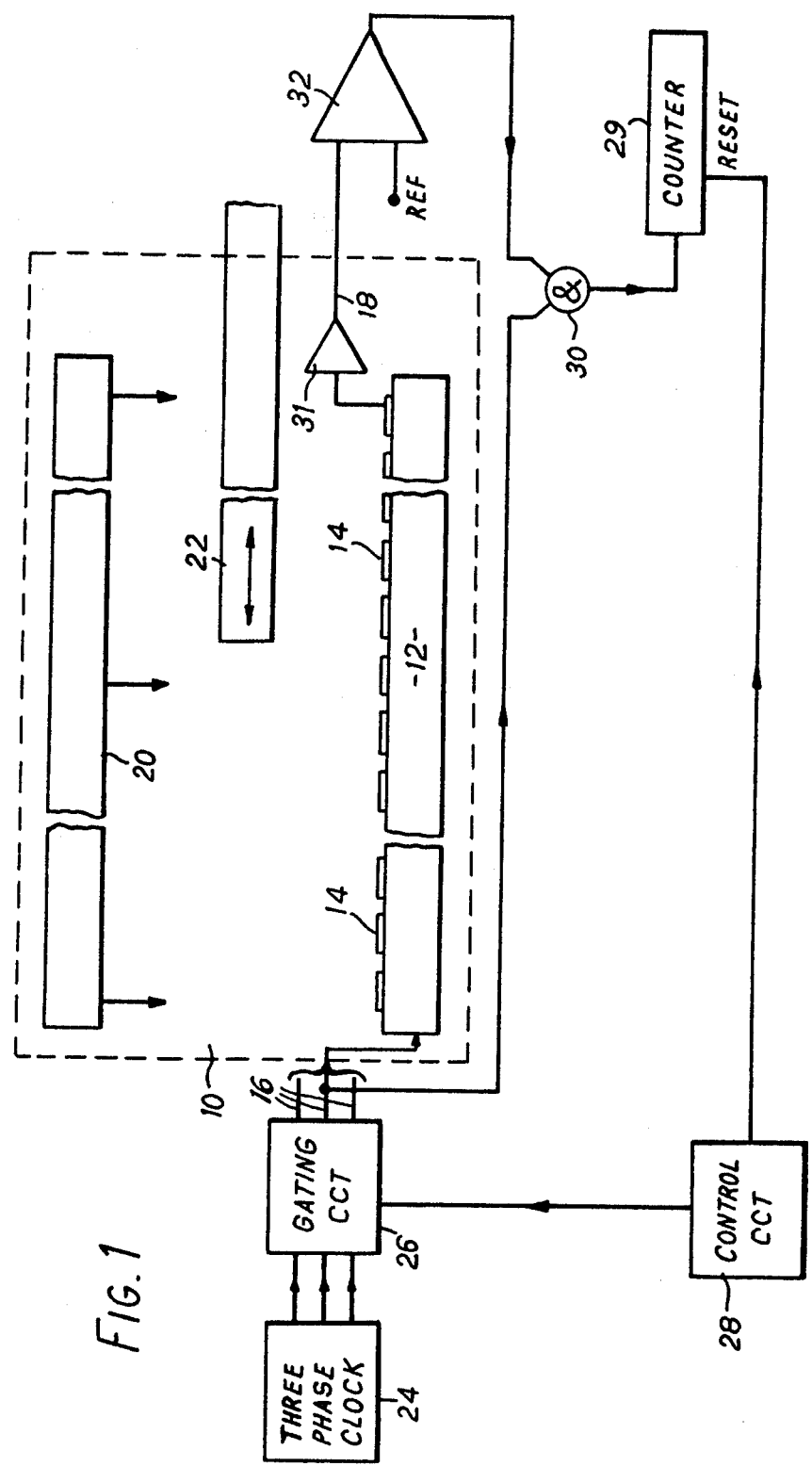
FIG. 1 is a simplified schematic view of a first embodiment of a linear displacement transducer in accordance with the present invention, together with a circuit for producing a digital output signal representative of the displacement being sensed by the transducer.

The linear displacement transducer shown in FIG. 1 is indicated generally at 10, and comprises a multi-stage charge-coupled device 12. The device 12 typically has one hundred stages 14, each of which is light-sensitive, and is implemented as an integrated circuit on a single silicon substrate: a typical example of such a device is the type CD 100 charge-coupled device manufactured by GEC Semiconductors Limited of East Lane, Wembley, Middlesex, England. The stages 14 of the device 12 are uniformly spaced along a straight line, which is arranged to extend in the direction of the linear displacement to be transduced.

The device 12 has three clock inputs 16 for receiving a three-phase clock signal, and an output 18 connected to the output stage thereof (the rightmost stage as viewed in FIG. 1).

A light source 20 is disposed adjacent the upper surface of the device 12, so as to be capable of substantially uniformly illuminating all the stages 14 of the device 12, and a moveable obturating member or arm 22 is disposed between the light source 20 and the upper surface of the device 12, closely adjacent to the latter.

In operation, the arm 22 is connected to a moveable element (not shown) whose displacement is to be transduced, and thus moves with the moveable element, while the device 12 and the light source 20 are arranged to be stationary. As the arm 22 moves to the left as viewed in FIG. 1, it obturates (ie prevents the illumination of) an increasing number of successive stages 14 of the device 12, while as the arm 22 moves to the right, it uncovers (ie permits the illumination of) an increasing number of successive stages 14 of the device 12.

In each of the stages 14, a charge whose magnitude is dependent on the level and duration of the illumination of the stage is produced, so that the level of the charge in the illuminated stages is different from the level of the charge in the non-illuminated stages: the boundary at which this difference in charge level occurs is determined by the position of the leftmost end of the arm 22, and thus by the position of the moveable element. In order to determine the position of this boundary, the charge distribution in the device 12 is read out serially.

To this end, a three-phase clock signal generator 24, having a typical operating frequency of about 1MHz, is connected via a gating circuit 26 to the clock inputs 16 of the device 12. The gating circuit 12 is connected to be periodically enabled by a control circuit 28, typically for just over 100 microseconds in every 100 milliseconds. The control circuit 28 is also connected to a counter 29 so as to reset the count in the counter to zero at the same instant that the gating circuit 26 is enabled.

When the gating circuit 26 is enabled, the three-phase clock signal produced by the generator 24 is applied to the clock inputs 16 of the device 12. The clock signal at one of the inputs 16 is also applied to the counter 29 via an enabled AND gate 30. Each cycle of the clock signal causes the illumination-dependent charge produced in each stage of the device 12 during the interval since the gating circuit 26 was previously enabled to be shifted to the next successive stage in the direction of the output stage (ie to the right as viewed in FIG. 1). There thus appears at the output 18 of the device 12 an output signal whose level takes a succession of values each corresponding to the level of the charge in a respective stage of the device 12: it will be appreciated that the first level of the output signal corresponds to the level of the charge in the last (or output) stage of the device 12, the second level of the output signal corresponds to the level of the charge in the penultimate stage of the device 12 and so on. Preferably, the output signal appearing at the output 18 is amplified within the device 12 prior to its appearance at the output 18, as shown at 31.

The output signal produced at the output 18 of the device 12 is applied to one input of a comparator 32, whose other input is connected to receive a predetermined reference signal. The level of the predetermined reference signal is selected to lie about midway between a first level of the output signal corresponding to the charge level of a fully illuminated stage of the device 12 and a second level of the output signal corresponding to the charge level of a non-illuminated stage of the device 12. When the level of the output signal changes from the second level to the first level, indicating the arrival at the output stage of the device 12 of the charge from the first illuminated stage from the right of the device 12, the comparator 32 produces an output control signal which disables the AND gate 30.

The count accumulated in the counter 29 at the instant the AND gate 30 is disabled is therefore equal to the number of cycles of the clock signal from the generator 24 required to shift the charge in the rightmost illuminated stage of the device 12 to the output stage, and therefore equal to the number of stages obturated by the arm 22. The position of the leftmost end of the arm 22 with reference to the rightmost stage of the device 12 is thus known in terms of the spacing between the stages of the device 12. Since the device 12 is extremely dimensionally stable and is made by techniques which provide a very high accuracy of the spacing between its stages, the position of the leftmost end of the arm 22 and therefore the position of the moveable element whose displacement is being transduced are accurately determined. The displacement of the moveable element with reference to a datum position can be determined by subtracting a digital number representative of the datum position (in terms of the number of stages of the device 12 between the datum position and the rightmost stage of the device 12), from the count in the counter 29 at the end of each determination of the current position of the moveable element.

Figure 2:
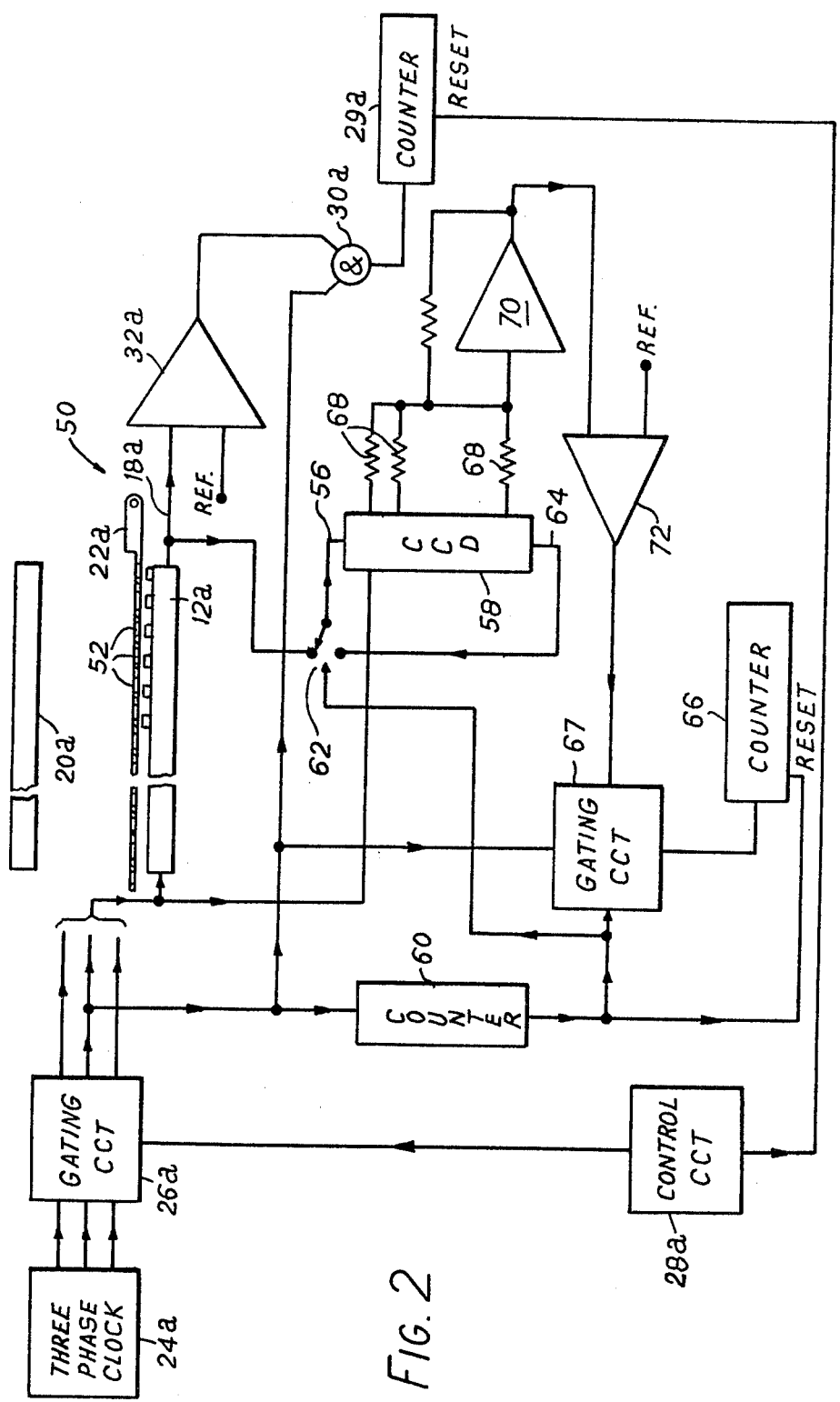
FIG. 2 is a simplified schematic view of a second embodiment of a linear displacement transducer in accordance with the present invention, together with a modified form of the circuit of FIG. 1.

The linear displacement transducer FIG. 2 is indicated generally at 50, and has parts and associated circuit elements in common with the transducer 10 of FIG. 1. These common parts and circuit elements will therefore be given the same reference numerals as were used in FIG. 1, but with the suffix a, and only the points of difference will be described in detail.

Figure 3:
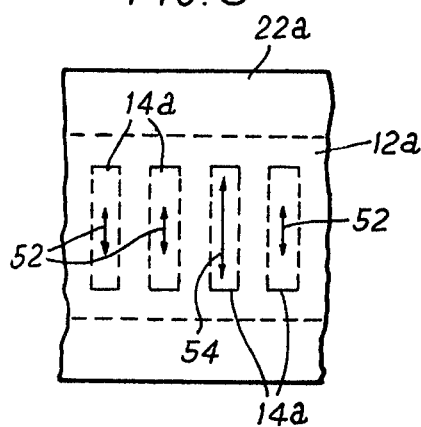
FIG. 3 is an enlarged view of part of the transducer of FIG. 2.

Thus the transducer 50 comprises a charge-coupled device 12a, a light source 20a and an obturating member 22a disposed substantially as shown in FIG. 1, but the obturating member 22a comprises a grating having a plurality of light-transmissive lines 52 therein. The lines 52 extend perpendicular to the direction of movement of the member 22a and are uniformly spaced apart in this direction. The spacing of the lines 52 is such that one hundred and one of them occupy exactly the same length as the one hundred stages 14a of the device 12a. Further, the length of the member 22a is such that it completely covers the device 12a for all anticipated displacements of the moveable member to which the member 22a is connected, and one of the lines, near the central stages of the device 12a, is appreciably wider and longer than the others: this one line is indicated at 54 in FIG. 3.

Figure 4:
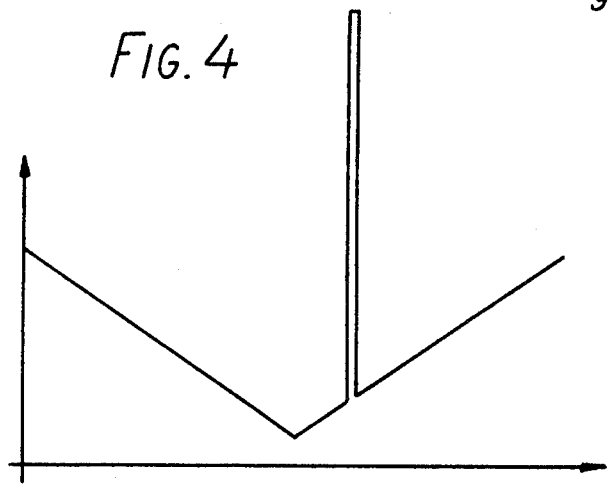
FIG. 4 is a waveform diagram for use in explaining an aspect of the operation of the transducer and circuit of FIGS. 2 and 3.

It will be appreciated that when the rightmost stage of the device 12a is exactly aligned with a line of the member 22a, then so will be the leftmost stage. Thus, the level of illumination of the stages will fall substantially linearly from respective maxima at each end of the device 12a to a minimum in the middle of the device. There will, however, be a peak in the level of the illumination corresponding to the position of the line 54, whose dimensions are chosen to ensure that this peak is always larger than the peak due to the other lines. The charge distribution in the stages of the device 12a thus approximates to one cycle of a triangular wave, with a peak corresponding to the position of the line 54, as shown in FIG. 4. If the member 22a then moves a distance equal to the spacing between two adjacent stages of the device 12a, this triangular charge distribution moves the whole length of the device 12a, i.e. its phase changes substantially linearly through 360°, but the peak corresponding to the line 54 just moves the distance between two adjacent stages of the device 12a.

The charge distribution is serially read out of the device 12a as described with reference to FIG. 1, with the following exceptions.

Firstly, the predetermined reference signal applied to the other input of the comparator 32a is selected to lie about midway between the respective levels of the signal at the output 18a corresponding to the charge in a stage of the device 12a illuminated via the line 54 and the charge in a stage of the device 12a fully illuminated via one of the other lines, so that the comparator 32a is triggered to produce its output control signal when the charge peak from the stage illuminated via the line 54 reaches the output stage of the device 12a. The count in the counter 29a at this instant gives a coarse determination of the position of the member 22a, in terms of the integral number of stages between the line 54 and the rightmost end of the device 12a.

Secondly, the output 18a of the device 12a is connected to the input 56 of another one hundred stage charge-coupled device 58 arranged to operate as a correlator. After one hundred cycles of the clock signal produced by the clock 24a, the charge distribution in the device 58, which is controlled by the same clock signal as the device 12a, corresponds to that which existed in the device 12a at the commencement of the application of the clock signal to the device 12a: these one hundred cycles are counted by a counter 60 which overflows at a count of one hundred. When the counter 60 overflows, it operates a change over switching device 62, which connects the output 64 of the device 58 to its input 56; additionally, counter 60 resets to zero another counter 66, and enables a gating circuit 67 which permits the counter 66 to commence counting one phase of the clock signal being applied to the device 58.

Each stage of the device 58 is connected via a respective resistor 68 to the input of a summing amplifier 70, the resistors 68 being weighted in accordance with one cycle of a triangular weighting function. As the triangular charge distribution entered in the device 58 circulates therearound, the level of the output signal produced by the summing amplifier 70 continuously changes, since it is representative of the correlation function between the instantaneous charge distribution in the dvice 58 and the weighting function of the resistors 68. A comparator 72 is connected to the output of the summing amplifier 70, and is arranged to produce a control signal when the level of the output signal produced by the summing amplifier 70 passes through a predetermined value, eg. zero. The control signal produced by the comparator 72 disables the gating circuit 67. The count in the counter 66 at this instant is therefore representative of the phase difference between the triangular charge distribution originally in the device 12a and a reference triangular wave determined by the triangular weighting function of the resistors 68, and thus gives a fine determination of the position of the member 22a with respect to two adjacent stages of the device 12a.

To summarise, the final count in the counter 29a identifies the two adjacent stages of the device 12a between which a chosen point, (eg the line 54) on the member 22a lies, while the final count in the counter 66 permits the exact position of this chosen point between the two identified stages to be interpolated. If both of the counters 29a and 66 are BCD counters, it is a simple matter to arrange that their respective contents can be additively combined to form a single four-decade BCD signal: for example, these counters can be constituted by a single four-decade BCD counter, in which the output of the gate 30 is applied to the second most significant decade and the output of the gating circuit 67 is applied to the least significant decade.

Figure 5:
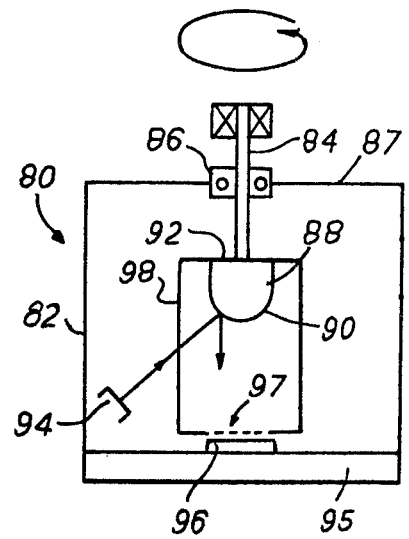
FIGS. 5 and 6 are simplified schematic views, in elevation and plan respectively, of a rotary displacement transducer in accordance with the present invention.

FIG. 5 shows, at 80, a rotary version of the transducer of FIG. 2. The transducer 80 comprises a substantially cylindrical housing 82, and a shaft 84 which extends coaxially from the interior to the exterior of the housing and which is rotatably supported in a bearing 86 mounted in one end face 87 of the housing. The end of the shaft 84 outside the housing 82 is adapted to be connected to a rotable member (not shown) whose rotary displacement is to be transduced, while its other end is attached to a mirror 88. The mirror 88 has an approximately hemispherical reflective surface 90, and a circular back or non-reflective surface 92 coaxially secured to the shaft 84. The axial profile of the reflective surface 90 is shaped to ensure that light from a light source 94 disposed inside the housing 82 is reflected axially of the housing towards its other end face 95, regardless of the angular position of the shaft 84 and mirror 88.

Figure 6:
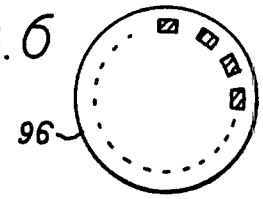

A one-hundred stage charge-coupled device 96 is mounted on the inside surface of the end face 95, so that its stages can receive the light reflected by the mirror 88. The device 96 is generally similar to the devices 12 and 12a, except that its one hundred stages are equiangularly spaced apart around a circle coaxial with the housing 82 and shaft 84, as shown in FIG. 6.

A circular grating 97 lying in a plane extending radially of the housing 82 is disposed between the device 96 and the mirror 88, and is coaxially connected to the mirror 88 by means of a substantially cylindrical translucent or transparent support 98. The grating 97 thus rotates with the mirror 88 and the shaft 84. The grating 97 has one hundred and one radially extending light-transparent lines (not shown) therein, these lines being equiangularly spaced apart around a circle of the same radius as, and coaxial with, the circle around which the stages of the device 96 lie. One of the lines of the grating 97 is longer and wider than the others, as described in relation to the member 22a of FIG. 2.

It will be appreciated that the charge distribution in the device 96, and the way this charge distribution changes as the rotatable member, the shaft 84 and the grating 97 rotate together, are both exactly analogous to those described with reference to the transducer 50 of FIG. 2. The device 97 is therefore connected to circuitry identical to that described with reference to FIG. 2, and its output signal is processed in an identical manner to determine the coarse and fine angular positions of the rotatable member.

Many modifications can be made to the described embodiments of the invention. For example, the obturating member 22 of the FIG. 1 embodiment can be replaced by a member having a small aperture which permits the illumination of only one stage of the device 12 at a time, or by a member arranged to obturate only one stage of the device 12 at a time. In the embodiment of FIG. 2, the line 54 can be identical to the other lines, and the coarse position determination can be effected by means of another charge-coupled device which is identical to the device 12 and has its stages arranged, on the same silicon substrate, parallel to those of the device 12; in this case, the member 22a is modified to have an integrally formed portion which co-operates with this other charge-coupled device in a manner analogous to the co-operation between the device 12 and member 22 of the FIG. 1 embodiment.

A modification analogous to the foregoing modification to the FIG. 2 embodiment can be made to the embodiment of FIGS. 5 and 6; in this case the "coarse" and "fine" charge-coupled devices are concentrically disposed on the same silicon substrate. Alternatively, in the embodiment of FIGS. 5 and 6, the grating 97 can be replaced by a member which permits the illumination of, or obturates, only one stage of the device 96 at a time, thus rendering the mode of operation of this embodiment similar to that of the FIG. 1 embodiment.

In all of the embodiments, the obturating member or grating can be connected to the member whose displacement is to be transduced by way of a mechanical linkage having a step-up or step-down displacement ratio. In particular, this linkage can include a rack and pinion, so that, for example, the displacement transducer 10 of FIG. 1 can be converted into a rotary displacement transducer by forming the member 22 integrally with a rack (or securing it to one), and driving this rack by means of a pinion driven by a rotatable member whose displacement is to be transduced. Also in all of the embodiments, the charge-coupled device can be adapted to be secured to the moveable or rotatable member whose displacement is to be transduced, and the obturating member or grating can be stationary.

Finally, the correlator or transversal filter based on the charge-coupled device 58 can be modified by omitting the resistors 68 and arranging for each stage of the device 58 to have a suitably weighted split tap output (i.e. each storage electrode in each stage of the device 58 is split into 2 parts, one of which constitutes an output, and weighting is achieved by varying the relative aeas of the 2 parts.

We claim:

1. A displacement transducer comprising:
    a charge-coupled device having a plurality of light-sensitive stages arranged in a line,
    a light source,
    an obturating member disposed between the light source and the charge-coupled device, the charge-coupled device and the obturating member being relatively movable in dependence upon the displacement to be transduced so as to vary the amount of light received by, and the charge accumulated in, respective stages of the charge-coupled device in accordance with the relative positions of the charge-coupled device and the obturating member,
    a clock pulse generator for applying clock pulses to the charge-coupled device to successively shift the respective charge in each stage of the device towards an output stage, whereby to produce from said output stage an output signal whose level takes a succession of values each corresponding to the charge in a respective stage of the device, and
    means responsive to said output signal to derive a signal in accordance with the relative positions of the device and the member.

2. A transducer as claimed in claim 1, wherein said means responsive to said output signal comprises a comparator connected to receive said output signal and arranged to produce a control signal when the level of said output signal passes through a predetermined value, said predetermined value lying between the respective values of the level of the output signal which correspond to the charge in an illuminated stage of the device and the charge in a non-illuminated stage of the device.

3. A transducer as claimed in claim 2, wherein said means responsive to said output signal includes a counter arranged to count the number of shifts produced prior to the production of said control sugnal, whereby the count in the counter when said control signal is produced is representative of the relative positions of the charge-coupled device and the obturating member.

4. A transducer as claimed in claim 1, wherein the obturating member is adapted to be connected, in use, to a movable element whose displacement is to be transduced, and the charge-coupled device is arranged to be stationary in use.

5. A transducer as claimed in claim 1, wherein the stages of the charge-coupled device are arranged in a straight line, in order to transduce linear displacements.

6. A transducer as claimed in claim 1, wherein the stages of the charge-coupled device are uniformly spaced apart.

7. A transducer as claimed in claim 1, wherein the obturating member is arranged to prevent the illumination of an increasing number of successive stages of the charge-coupled device in response to relative movement between the obturating member and the charge-coupled device in one direction, and to permit the illumination of an increasing number of successive stages of the charge-coupled device in response to relative movement between the obturating member and the charge-coupled device in the opposite direction.

8. A displacement transducer comprising:
a charge-coupled device having a plurality of light-sensitive stages arranged in a line,
a light source,
an obturating member disposed between the light source and the charge-coupled device, the charge-coupled device and the obturating member being relatively movable in dependence upon the displacement to be transduced so as to vary the amount of light received by, and the charge accumulated in, respective stages of the charge-coupled device in accordance with the relative positions of the charge-coupled device and the obturating member,
the obturating member including a grating having a plurality of light-transmissive lines thereon, the width of the lines and their spacing from one another along the line of the stages of the device being of similar dimensions and being such that the number of lines which occupy the total length occupied by all the stages of the device differs by 1 from the number N of said stages, whereby the charge distribution in the device corresponds to one cycle of a triangular wave whose phase changes substantially linearly through 360° as the obturating member moves a distance equal to the spacing of two adjacent stages of the device.

9. A transducer as claimed in claim 8, further comprising a clock pulse generator for applying clock pulses to the device to successively shift the respective charge in each stage of the device towards an output stage, whereby to produce an output signal whose level takes a succession of values each corresponding to the charge in a respective stage of the device, and means for determining the phase difference between a reference triangular wave and the output signal produced during N shifts.

10. A transducer as claimed in claim 9, wherein the phase difference determining means comprises a further N stage charge-coupled device connected to receive said output signal and said clock pulses, such that said output signal is shifted through the further device at the same rate as the charge is shifted through the first mentioned device, a plurality of weighted outputs each connected between a respective stage of the further device and the input of a summing amplifier, said weighted outputs being weighted in accordance with a weighting function corresponding to said reference triangular wave, and a comparator connected to the output of the summing amplifier and arranged to produce a first control signal when the level of the summed signal at the output of the summing amplifier passes through a predetermined value.

11. A transducer as claiemd in claim 10, wherein the grating includes one line which is adapted to transmit substantially more light than the other lines, and including a further comparator connected to receive said output signal and arranged to produce a further control signal when the level of said output signal passes through a predetermined value lying between the respective values of the level of the output signal which correspond to the charge in a stage of the first device illuminated via said one line of the grating and the charge in a stage of the first device fully illuminated via any one of the other lines of the grating.

12. A transducer as claimed in claim 11, including a first counter arranged to count the number of shifts in excess of N produced prior to the production of the first control signal, and a second counter arranged to count the number of shifts produced prior to the production of the further control signal.

13. A transducer as claimed in claim 10, including a first counter arranged to count the number of shifts in excess of N produced prior to the production of the first control signal.

14. A transducer as claim in claim 8, wherein the grating includes one line which is adapted to transmit substantially more light than the other lines.

15. A displacement transducer comprising:
a charge-coupled device having a plurality of light-sensitive stages arranged in a line,
a light source, and
an obturating member disposed between the light source and the charge-coupled device, the charge-coupled device and the obturating member being relatively movable in dependence upon the displacement to be transduced so as to vary the amount of light received by, and the charge accumulated in, respective stages of the charge-coupled device in accordance with the relative positions of the charge-coupled device and the obturating member,
the stages of the charge-coupled device being arranged in a line extending around at least part of the circumference of a circle, in order to transduce rotary displacements.

* * * * *